US010885974B2

United States Patent
Gingrich et al.

(10) Patent No.: US 10,885,974 B2
(45) Date of Patent: Jan. 5, 2021

(54) SUPERCONDUCTING SWITCH (71) Applicants: Eric C. Gingrich, Elkridge, MD (US); Randall M. Burnett, Catonsville, MD (US); Donald L. Miller, Export, PA (US)

(72) Inventors: Eric C. Gingrich, Elkridge, MD (US); Randall M. Burnett, Catonsville, MD (US); Donald L. Miller, Export, PA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/261,842

(22) Filed: Jan. 30, 2019

(65) Prior Publication Data
US 2020/0243133 A1  Jul. 30, 2020

(51) Int. Cl.
*G11C 11/44* (2006.01)
*G11C 11/16* (2006.01)
(Continued)

(52) U.S. Cl.
CPC ............ *G11C 11/44* (2013.01); *G11C 11/161* (2013.01); *G11C 11/1675* (2013.01);
(Continued)

(58) Field of Classification Search
CPC ... G11C 11/44; G11C 11/161; G11C 11/1675; H01L 27/18; H01L 39/025; H01L 39/223; H03K 19/195
(Continued)

(56) References Cited

U.S. PATENT DOCUMENTS 9,013,916 B2  4/2015  Naaman et al.
9,208,861 B2  12/2015  Herr et al.
(Continued)

OTHER PUBLICATIONS

Burm Baek et al: "Hybrid superconducting-magnetic memory device using competing order parameters", Nature Communications, vol. 5, No. 1, May 28, 2014 (May 28, 2014), XP055685515, DOI: 10.1038/ncomTis4888 p. 4, left-hand column , paragraph 2-p. 5, right-hand column; paragraph 1; figures 2,3,4.
(Continued)

*Primary Examiner* — Harry W Byrne
(74) *Attorney, Agent, or Firm* — Tarolli, Sundheim, Covell & Tummino LLP (57) ABSTRACT

A bistable device allows supercurrent to flow when functioning in one regime, wherein magnetization directions of different magnetic layers are antiparallel, but restricts supercurrent when switched to function in a resistive regime, wherein the magnetization directions are parallel. In the first regime, the device acts as a Josephson junction, which allows it to be used in superconducting quantum interference devices (SQUIDs) and other circuits in which quantization of magnetic flux in a superconducting loop is desired. In the second, resistive regime, flux quantization is effectively eliminated in loops containing the device, and current is diverted to parallel superconducting components. The bistable device thereby acts as a superconducting switch, useful for a variety of circuit applications, including to steer current for memory or logic circuits, adjust logical circuit functionality at runtime, or to burn off stray flux during cooldown.

20 Claims, 4 Drawing Sheets (51) Int. Cl.
*H01L 27/18* (2006.01)
*H01L 39/02* (2006.01)
*H01L 39/12* (2006.01)
*H01L 39/22* (2006.01)
*H03K 19/195* (2006.01)
*H01L 43/10* (2006.01)
*H03K 19/20* (2006.01)

(52) U.S. Cl.
CPC ............ *H01L 27/18* (2013.01); *H01L 39/025* (2013.01); *H01L 39/125* (2013.01); *H01L 39/223* (2013.01); *H03K 19/195* (2013.01); *H01L 43/10* (2013.01); *H03K 19/20* (2013.01)

(58) Field of Classification Search
USPC .................. 365/158, 129, 171, 173, 80, 81
See application file for complete search history.

(56) References Cited

U.S. PATENT DOCUMENTS

| | | | |
|---|---|---|---|
| 9,281,057 B1 | 3/2016 | Herr et al. | |
| 9,520,188 B2 | 12/2016 | Toda | |
| 9,800,248 B2 * | 10/2017 | Villegas | H03K 19/1952 |
| 2017/0085269 A1 * | 3/2017 | Villegas | H03K 3/38 |

OTHER PUBLICATIONS

Joseph son junctions for cryogenic memory, arxiv.org, Cornell University Library, 201 Olin Library Cornell University Ithaca, NY 14853, Sep. 14, 2017 (Sep. 14, 2017), XP081307141, DOI: 10.1103/PYSREVB.97 .024517 p. 1, right-hand column, paragraph 1-p. 9, right-hand column, paragraph 2; figures 1,2.

A Vedyayev et al: "Spin-valve magnetic sandwich in a Josephson junction", Euro Physics Letters (EPL), vol. 71, No. 4, Jul. 15, 2005 (Jul. 15, 2005), pp. 679-685, XP055173253, ISSN: 0295-5075, DOI: 10.1209/epl/i2005-10118-y p. 684, paragraph 3; figure 1.

International Search Report for PCT/US2020/013362 dated Apr. 30, 2020.

Weides: "Josephson Tunnel Junctions with Ferromagnetic Interlayer", Schriften des Forschungszentrums Jülich, Reihe Informationstechnik, 2006, vol. 13, Forschungszentrum Jülich GmbH, Jülich, Germany.

* cited by examiner

SUPERCONDUCTING SWITCH

TECHNICAL FIELD

The present invention relates generally to superconducting circuit devices, and specifically to a superconducting switch.

BACKGROUND

Superconducting electronics can be implemented to provide high-performance computing with low energy consumption. In superconducting electronics, currents are distributed either by passive elements such as resistors or inductors, or by active circuit elements, such as Josephson junctions. In the steady state, inductors carry current without a voltage across them, while resistors carry no current when in parallel with a superconducting path. Josephson junctions can redirect current when their critical current is exceeded, and the amount of current redirected is determined by the quantization of magnetic flux in a superconducting loop.

A pseudo spin valve (PSV) barrier consists of two layers made of different ferromagnets with different coercivities. Giant magnetoresistance (GMR) is a quantum mechanical magnetoresistance effect observed in multilayers composed of alternating ferromagnetic and non-magnetic conductive layers. The GMR effect can be observed as a significant change in electrical resistance depending on whether magnetizations of adjacent ferromagnetic layers are in a parallel or an antiparallel alignment. Thus, a useful property of GMR devices with switchable magnetic layers is that the resistance of such devices can change based on the relative orientation of the magnetic layers. GMR devices are used in applications such as read heads for magnetic storage media and forms of non-volatile memory called magnetostatic random access memory (MRAM). These devices all operate at room temperature and as such do not take advantage of any properties of superconductors.

Superconducting Josephson junctions with magnetic barriers can serve as the basis for Josephson magnetic random access memory (JMRAM), as disclosed in U.S. Pat. No. 8,270,209 B2, entitled "Josephson Magnetic Random Access Memory System and Method," which is herein incorporated by reference. However, JMRAM relies on the oscillation of the relative Cooper pair phase with magnetic layer thickness to produce junctions which produce a Josephson phase of either zero or π radians, depending on the layer orientation. JMRAM requires that the junction have critical current in both states.

SUMMARY

One example includes a bistable device. The device has first and second superconducting metal layers, and first and second ferromagnetic layers that are both between the first and second superconducting metal layers. The device further has a normal metal spacer layer between the first and second ferromagnetic layers. The bistable device is configured to switch, based on a control signal, between a resistive regime in which the device exhibits a resistance of greater than about one milliohm, and a superconducting regime in which the device behaves as a Josephson junction.

Another example includes a superconducting switch having superconducting wires providing galvanic input and output to the switch. The switch further includes a first field line providing inductive input to the switch and a junction arranged between and connecting the wires, the junction having magnetic layers that can occupy one of a parallel or antiparallel magnetization configuration. The first field line is inductively coupled to at least one of the magnetic layers to provide controlled switching of the junction between the parallel or antiparallel magnetization configurations, thereby either permitting or cutting off supercurrent flow between the superconducting wires.

Yet another example includes a method of supercurrent switching. Supercurrent is provided to a junction that includes a free magnetic layer having a first magnetic coercivity and a fixed magnetic layer having a second magnetic coercivity that is higher than the first magnetic coercivity. The method continues by adjusting a current flowing through a write line that is inductively coupled to the free magnetic layer. A magnetization direction of the free magnetic layer is changed to be aligned with a magnetization direction of the fixed magnetic layer. A critical current of junction is thereby reduced (e.g., to zero), placing the junction in a resistive regime.

DETAILED DESCRIPTION

A bistable device allows supercurrent to flow when functioning in one regime, but restricts supercurrent when switched to function in a resistive regime. In the first regime, the device acts as a Josephson junction, which allows it to be used in superconducting quantum interference devices (SQUIDs) and other circuits in which quantization of magnetic flux in a superconducting loop is desired. In the second, resistive regime, flux quantization is effectively eliminated in loops containing the device, and current is diverted to parallel superconducting components. The bistable device thereby acts as a superconducting switch.

Figure 1:
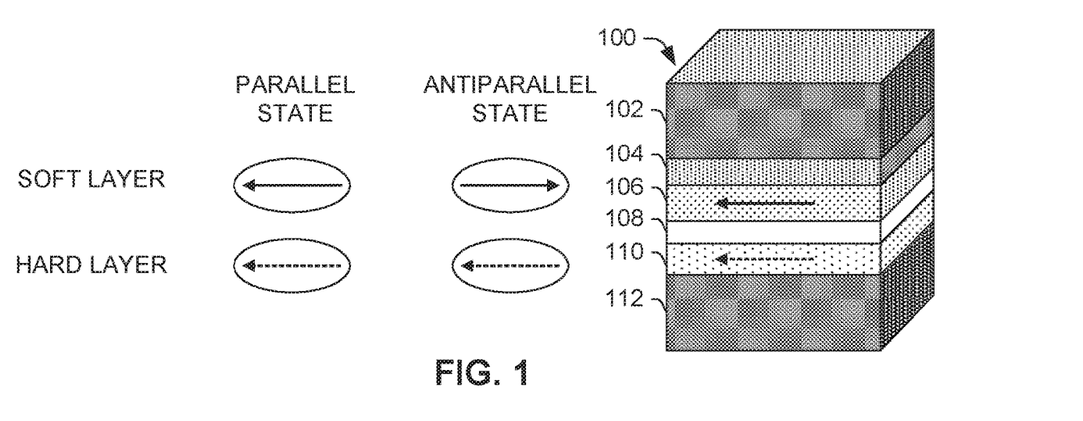
FIG. 1 is a layer diagram of a superconducting switch device with corresponding arrows indicating the respective parallel- and antiparallel-state magnetization directions for the soft and hard layers.

FIG. 1 shows an example bistable device 100, having a barrier between two galvanic terminals, that, in accordance with the provision of appropriate control inputs, switches between, on the one hand, a resistive regime, and, on the other hand, a superconducting regime in which the device behaves as a Josephson junction. By "behaves as a Josephson junction," it is meant that at levels of current through the device (i.e., between galvanic terminals of the device) below a predefined critical current that depends on the construction of the device, an interterminal supercurrent flows across the barrier, meaning that electron pairs can tunnel across the interterminal barrier in the device without any resistance, but when the current through the device exceeds the predefined critical current, a time-dependent voltage develops across the galvanic terminals of the device. By "behaves as a Josephson junction," it is further meant that the device is characterized by a Josephson phase that is proportional to the time integral of the voltage applied across the galvanic terminals of the device, and further that the supercurrent that flows across the barrier is a sinusoidal function of the Josephson phase.

As shown, example device 100 can be made as a Josephson junction with a PSV barrier consisting of at least two ferromagnetic layers 106, 110 separated by a normal metal spacer layer 108. A first magnetic layer 106 can be a "free" or "switching" layer fabricated using "soft" magnetic materials with low magnetic coercivity, while a second magnetic layer 110 can be a "fixed" layer fabricated using "hard" magnetic materials with high magnetic coercivity. In the context of the present application, magnetic coercivity of less than about twenty oersteds, e.g., between about five oersteds and about twenty oersteds, for example, constitutes low magnetic coercivity, and magnetic coercivity of greater than about fifty oersteds, e.g., between about fifty oersteds and about five hundred oersteds, constitutes high magnetic coercivity. In other examples of device 100, which may provide enhanced manufacturability, layer 110 is the free layer and layer 106 is the fixed layer in device 100. Depending on the desired characteristics of device 100, an insulating barrier layer 104 can be included to enhance the normal state resistance $R_N$ of device 100. Magnetic layers in device 100 can occupy two states, herein termed the parallel and antiparallel configurations, as also illustrated in FIG. 1. The respective states of magnetic layers can be affected, for example, by inputs provided on soft and hard field lines (not shown in FIG. 1), also herein termed magnetic write lines, that can inductively couple to the magnetic layers. Because the soft layer reacts more easily (i.e., switches at lower fields) than the hard layer, currents applied to the magnetic write lines will couple to both magnetic layers, but in practice only the soft layer exhibits switching, since the hard layer returns to its original configuration after current is removed from the magnetic write lines. The magnetic write lines can be superconducting lines to provide for reduced energy dissipation, but they need not be superconducting. Upper superconducting metal layer 102 and lower superconducting metal layer 112 act as galvanic contact layers to provide electrical current inputs/outputs to device 100.

In contrast to a synthetic antiferromagnet (SAF) barrier, in which the equilibrium state of the layers (i.e., with no magnetic field applied) is always with the magnetization of the two layers in opposite directions, and the magnetization of the layers can be partially aligned by applying a magnetic field, in the PSV barrier of device 100, the magnetic layers can be stable in either the parallel or antiparallel configuration, and can be switched between the two by applying magnetic fields that change the direction of the free layer while leaving the direction of the fixed layer unchanged. The normal metal spacer layer 108 is thick enough to minimize coupling between the two ferromagnetic layers 106, 110.

Spacer layer 108 can, for example, be made of any one of elemental copper (Cu), elemental ruthenium (Ru), elemental iridium (Jr), or elemental rhodium (Rh). Spacer layer 108 can have a thickness of, for example, between about 2.5 nanometers and about 7.5 nanometers, e.g., between about 3.75 nanometers and about 6.25 nanometers, e.g., between about 4.5 nanometers and about 5.5 nanometers, e.g., about 5.0 nanometers.

Magnetic layers 106, 110 can, for example, be made of any one of elemental nickel (Ni), elemental cobalt (Co), elemental iron (Fe), a cobalt-iron alloy (e.g., 1:1 CoFe), a nickel-iron alloy (NiFe), or a nickel-iron-chromium alloy (NiFeCr). In the case of each alloy mentioned, many different alloy concentrations can be used, provided that the alloy concentration is magnetic. The selection of materials for the different magnetic layers and spacer are interchangeable given appropriate tuning of the layer thicknesses; thus, for example, the PSV barrier can be made with a cobalt soft magnetic layer 106, a ruthenium spacer layer 108, and a cobalt-iron alloy hard magnetic layer 110, and, with appropriate tuning of the layer thicknesses, can be made to work just as well with a nickel-iron alloy soft magnetic layer 106, a copper spacer layer 108, and a cobalt-iron hard magnetic layer 110.

As examples, in a PSV barrier having a soft magnetic layer 106 made of a NiFe 80:20 permalloy and a hard magnetic layer 110 made of elemental nickel, soft magnetic layer 106 can have a thickness of between about 1.9 nanometers and about 2.1 nanometers, e.g., about 2.0 nanometers, while hard magnetic layer 110 can have a thickness of between about 1.62 nanometers and about 1.79 nanometers, e.g., about 1.7 nanometers.

When included, insulating barrier layer 104 increases the resistive-regime resistance of device 100 from a few milliohms (e.g., greater than about one milliohm, e.g., between about one and about ten milliohms, e.g., between about one and about five milliohms, e.g., between about one and about two milliohms) to a few ohms (e.g., greater than about one ohm, e.g., between about one and about ten ohms, e.g., between about one and about five ohms, e.g., between about one and about two ohms). Although a resistance of only a few milliohms may be useful in some applications, such a low resistance slows down the current-path switching timescale of device 100 by as much as several orders of magnitude as compared to when device 100 has a few-ohm resistance, making a few-milliohm-resistance device 100 less useful in a variety of applications as compared to a device 100 having a resistive-regime resistance in the range of ohms. Insulating barrier layer 104 can, for example, be made of any one of aluminum oxide, tantalum nitride, niobium silicon, aluminum nitride, hafnium oxide, or any other material that can form a dielectric barrier. As examples, insulating barrier layer 104 can have a thickness of between about 0.64 nanometers and about 0.96 nanometers, e.g., between about 0.72 nanometers and about 0.88 nanometers, e.g., about 0.80 nanometers.

Upper superconducting galvanic contact 102 and lower superconducting galvanic contact 112 can each be made, for example, of a superconducting metal, e.g., niobium, niobium nitride, or aluminum. These layers of device 100 galvanically connect the device to other parts of a circuit.

Figure 2A:
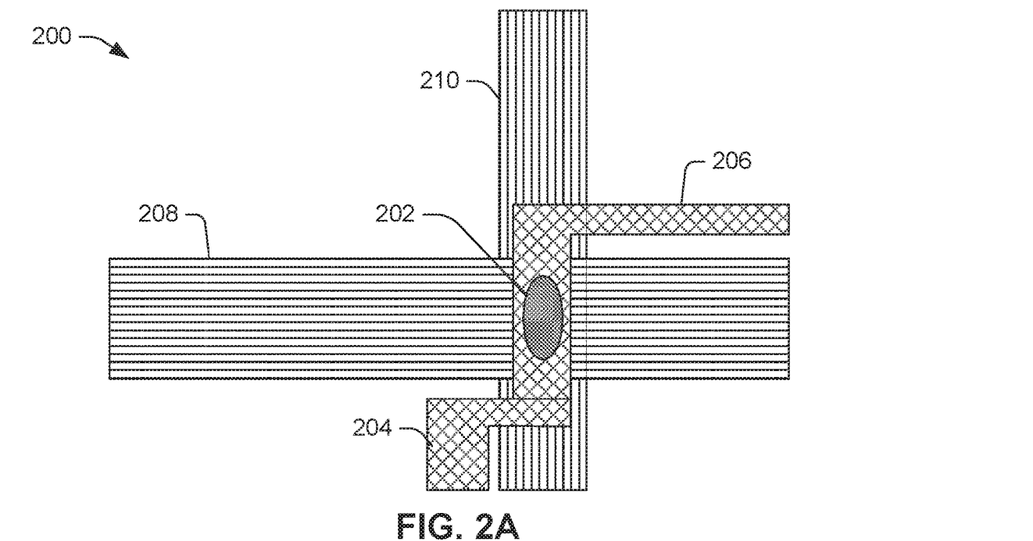
FIG. 2A is a plan view of a superconducting switch device including current wires and magnetization write lines.
Figure 2B:
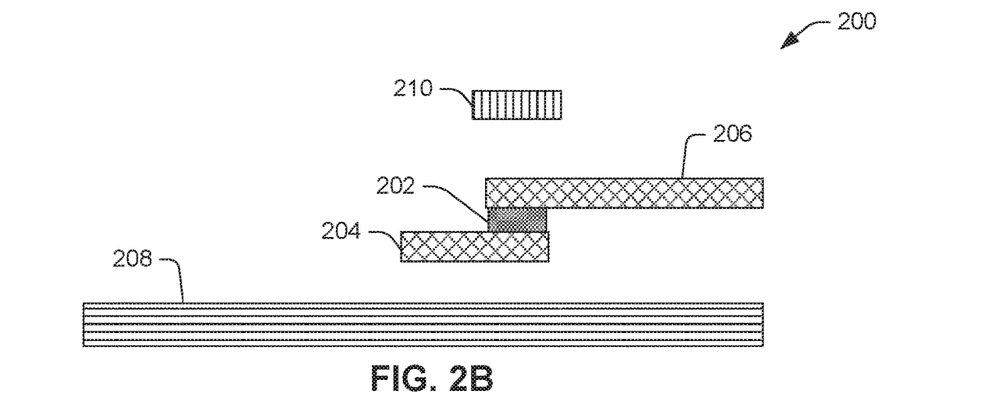
FIG. 2B is a cross-section view of the superconducting switch device of FIG. 2A.

FIGS. 2A and 2B respectively show plan and cross-sectional views of a superconducting switch 200 that can be implemented in an integrated circuit (IC) chip and can include a bistable superconducting device 202 that can correspond, for example, to bistable superconducting device 100 of FIG. 1 or a portion thereof (e.g., only layers 106, 108, 110, or only layers 104, 106, 108, 100). Thus, bistable superconducting device 202 can have a number of layers, including magnetic layers. In addition to bistable superconducting device 202, switch 200 can also include current-in wire 204 and current-out wire 206 by which switch 200 can be connected to other parts of a circuit in which switch 200 is integrated, e.g., on an IC. Thus, for example, current-in wire 204 can be galvanically connected to or can include one of layers 102, 112 in the device 100 of FIG. 1, while current-out wire 206 can be galvanically connected to or can include the other of layers 102, 112. Wires 204, 206 can each be fabricated, for example, from a superconducting metal, e.g., niobium, niobium nitride, or aluminum.

Switch 200 can also include easy axis field line 208, which can also be referred to as a write line, in that in some example applications, line 208 is capable of writing a binary state to device 202 to either permit or cut-off supercurrent flow between current-in wire 204 and current-out wire 206. In some examples, switch 200 can further include hard axis field line 210. "Easy axis" and "hard axis" are terms used to describe the preferred orientation of the magnetic layers and the orthogonal to this direction, whereas "soft" and "hard" are used to describe the strength of field it takes to change the magnetization direction of the individual layers. Where included, write lines 208, 210 can be inductively coupled to a soft magnetic layer of device 202 to enable controlled switching of the magnetically soft layer between a state in which its magnetization is parallel to that of the magnetically hard layer and a state in which its magnetization is antiparallel to that of the magnetically hard layer. Thus, establishing a current through write line 208 or, in some examples, through lines 208, 210 in turn generates a magnetic field that will induce the magnetization direction of the soft magnetic layer to reverse, which reversal remains even when the magnetic field is removed, e.g., by the cessation of current through write lines 208 or 208 and 210. In contrast, the hard magnetic layer is only affected while the magnetic field is active. Once the fields are turned off, the hard magnetic layer returns to its original configuration. The magnetic fields generated by lines 208, 210 are configured so as not to be high enough to drive a switch in the hard magnetic layer. Inclusion of hard axis field line 210 permits switch 200 to force the free layer (i.e., the soft magnetic layer) to orient in its hard axis direction before the use of easy axis field line 208 to tip the magnetization into a desired direction, in a process known as high hard axis switching.

In the plan view of FIG. 2A, looking down on and normal to a transverse plane of switch 200, hard axis field line 210 is illustrated as "below" other components 202, 204, 206, 208 for illustration purposes, but hard axis field line 210 can be "above" the other components as shown in the cross-sectional view of FIG. 2B, which looks in on and normal to a longitudinal plane of switch 200.

Figure 3A:
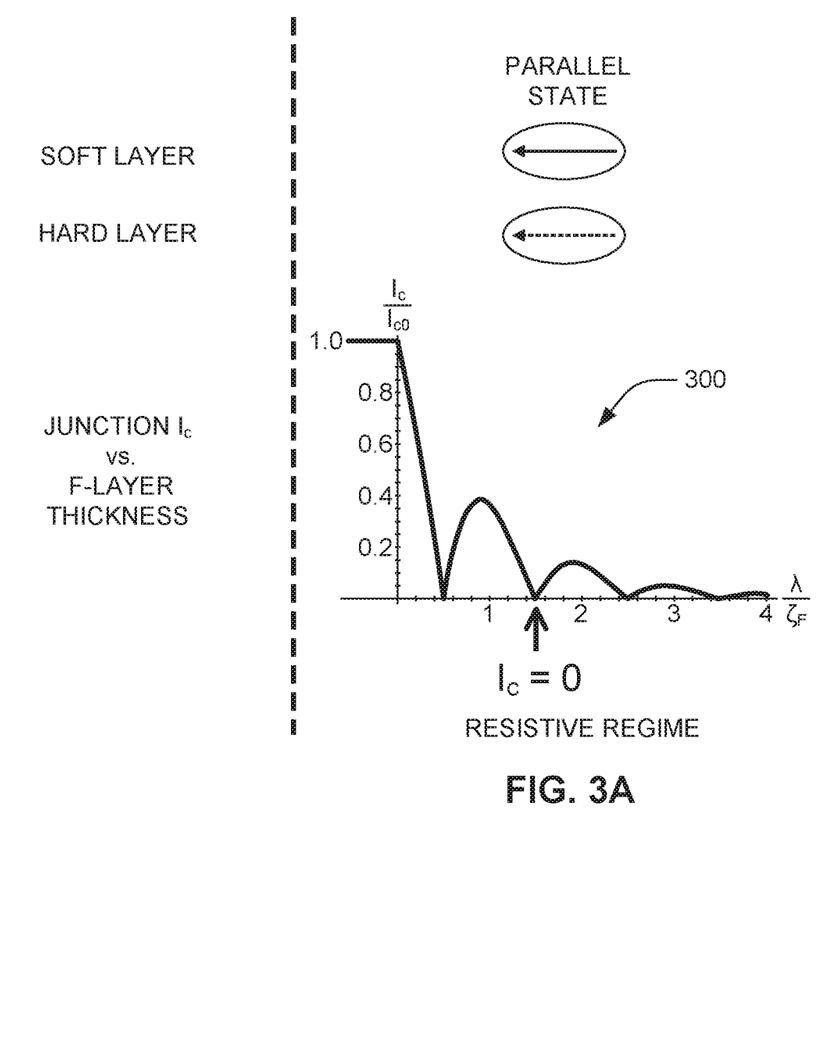
FIGS. 3A and 3B are example critical current plot showing minimization and maximization of a superconducting switch's critical current in the parallel and antiparallel state, respectively.
Figure 3B:
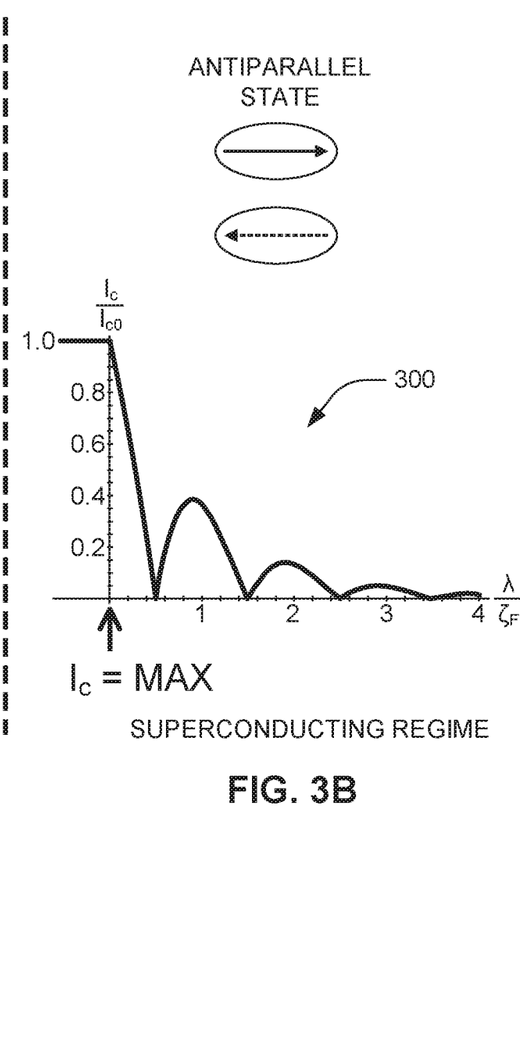

FIGS. 3A and 3B illustrate the operation of an example bistable superconducting device such as device 100 of FIG. 1. The two identical plots of oscillation curve 300 of FIGS. 3A and 3B graph normalized critical current $I_c/I_{c0}$ of a bistable superconducting device as described herein (e.g., device 100) as a function of Cooper pair phase $\lambda/\zeta_F$, where $\lambda$ is the effective magnetic layer thickness, $\zeta_F$ is the magnetic layer thickness needed to rotate the Cooper pair phase by $\pi$, and $I_{c0}$ represents the full maximum critical current for a corresponding Josephson junction-type device that has no ferromagnetic material. Cooper pairs are bound electron pairs that are responsible for superconductivity. Each Cooper pair has a spin-up electron and a spin-down electron. When a Cooper pair crosses a ferromagnet, the spin-up electron acquires a phase relative to the spin-down electron. This relative phase manifests as an oscillation of the critical current as a function of the thickness of the ferromagnetic layer.

The plots 300 thus show decay and oscillation of Cooper pairs in terms of the critical current with increasing thickness of the junction. Specifically, the horizontal axis of plots 300 is Cooper pair phase in units of $\pi$; in devices such as device 100, the Cooper pair phase is directly related to the thickness of the junction. The parallel state of FIG. 3A increases the phase of the Cooper pairs to a node in the supercurrent oscillations. The antiparallel state of FIG. 3B reduces the phase change to zero, allowing maximum supercurrent to flow through the junction (e.g., device 100). The thicknesses of the ferromagnetic layers, such as layers 106, 110 in device 100, can be chosen such that when the magnetizations of these ferromagnetic layers are aligned, the relative Cooper pair phase shift is such that the critical current across device (e.g., device 100) is zero, as indicated by the upward-pointing arrow in FIG. 3A. This places the device in a completely resistive regime. This resistance can be controlled, within limits.

The Cooper pair decay and oscillation shown in plots 300 is a characteristic feature of magnetic Josephson junctions, which are the only structure in the superconducting world known to demonstrate this behavior. When the two magnetic layers are in the parallel state, they add like a thicker junction, whereas if they are in the antiparallel state, a cancellation in the phase accumulation is observed. Thus, the critical current in the parallel state comes down to a minimum, e.g., to zero, when the ferromagnetic layer thicknesses are appropriately tuned, as shown in FIG. 3A. In the parallel state, the junction demonstrates phase advancement, which pushes the $I_c$ position to a minimum in the oscillation curve 300. Oscillation curve 300 itself does not change with a switching magnetization orientation of the ferromagnetic layers between parallel and antiparallel. Instead, it is the position on the curve that changes with such switching, e.g., between the maximum (as shown in FIG. 3B) and one of the minima (as shown in FIG. 3A). Which one of the minima on oscillation curve 300 will be achieved by the switching is determined by the particular layer thicknesses chosen for ferromagnetic layers in the device. As an example, the first minimum could be chosen, instead of the second as illustrated in FIG. 3A, by thinning down both the free layer and the fixed layer (i.e., both the hard layer and the soft layer). Making both layers thicker would, accordingly, be a way to achieve a third or greater minimum.

In alternative configurations, the layer thicknesses can be adjusted such that the parallel state has a maximum critical current (e.g., at $\lambda/\zeta_F=2$ in the plots 300) and the antiparallel state has a minimum critical current (e.g., at $\lambda/\zeta_F=\frac{1}{2}$ in the plots 300). However, such configurations would suppress the critical current of both states due to the total thickness of the magnetic layers. A junction with $\lambda/\zeta_F=1$ has an equilibrium junction phase of $\pi$, which can be accounted for in the design of a circuit incorporating a device such as device 100 or switch 200. A junction phase of $\pi$ could provide an advantage in some circuits.

With only metals as a barrier, i.e., without insulating barrier layer 104, the resistance of device 100 can be a few milliohms. With the inclusion of insulating barrier layer 104, as shown in FIG. 1, the resistance can be increased to as large as a few ohms (e.g., greater than about one ohm, e.g., between about one and about ten ohms, e.g., between about one and about five ohms, e.g., between about one and about two ohms). When the magnetizations of layers 106, 110 are instead in the antiparallel state, the Cooper pair phase across one ferromagnetic layer is canceled by the phase induced across the other ferromagnetic layer. Proper tuning of the ferromagnetic layer thicknesses causes device 100 to possess a maximum critical current. When so tuned, free layer 106 can be switched between the parallel and antiparallel states by applying magnetic fields. Thus, device 100 itself is switchable between the superconductive and resistive regimes.

With appropriate tuning of the thicknesses of the layers, it is possible to achieve total suppression of the critical current $I_c$ of a bistable superconducting device or superconducting switch as described herein. That is, critical current $I_c$ can be made to be fully zero percent of its native value, i.e., the value it would otherwise have absent the inclusion of the magnetic and spacer layers, such that the device would more closely resemble a conventional Josephson junction. However, the device is still highly useful even when layer thickness tuning is suboptimal and full suppression is not possible. In most use cases, it is not necessary to switch the device into a purely resistive regime. As long as the critical current of the device is sufficiently suppressed, the device will behave essentially as a resistor. Thus, in some examples, the layer thickness is such that the device is switchable to within twenty percent or lower of the original critical current range, such that between a superconducting path or extremely low resistance path (e.g., of resistance on the order of milliohms or less).

With appropriate choice of the compositions and thicknesses of the magnetic layers, the critical currents of the two states of a magnetic barrier Josephson junction, such as the bistable superconducting device described herein, can be set independently at fabrication time. Previous approaches to using magnetic Josephson junctions (MJJs) assumed that the critical currents of the two states would be similar. Circuits have been designed with this assumption and significant effort has been devoted to making such junctions. However, in some circuits, significant advantages can be realized if the critical currents are different. For example, when the critical current of one state is zero, a switch can be realized, as described above. The availability of a superconducting Josephson junction-type device having two non-equal non-zero critical currents can provide benefits in circuit design, as discussed below.

A bistable superconducting device or superconducting switch as described herein has multiple uses in superconducting circuitry in general, and in reciprocal quantum logic (RQL) circuitry in particular. Conventional semiconductor transistors do not typically function at below about four kelvins, but many of the functions that they can be used for can be accomplished by superconducting switches as described herein. For example, as a high-impedance device, a superconducting switch as described herein can be used as a current driver. Conventional Josephson junctions are typically poor at delivering power. Because a superconducting switch as described herein can be switched into a resistive regime of a few ohms (e.g., greater than about one ohm, e.g., between about one and about ten ohms, e.g., between about one and about five ohms, e.g., between about one and about two ohms), it can be used to steer large amounts of current, e.g., on the order of milliamps or larger, relative to a standard thirty-five-microamp or fifty-microamp Josephson junction. Such a property makes a superconducting switch as described herein useful for signal amplification and writing magnetic memory, among other uses.

A switchable device that is zero resistance in a default regime and switchable into a resistive regime can be used to route a DC supply current when such current is split into different current paths. In superconducting applications, current follows the path of least resistance, and given enough time to switch, one hundred percent of current will take a zero-resistance path in preference over a higher-resistance switched-element path. The higher the resistance that the switchable device is able to switch to, the greater the speed at which the current toggle between the paths completes, but even 0.1 milliohms in a path can switch current when compared to a zero-resistance superconducting path.

One RQL application of the presently described devices or switches is the implementation of a field programmable gate array (FPGA) circuit. By switching the critical current of a junction such as device 100 from very small to very large relative to RQL junction sizes, it is possible to activate or block off branches in a circuit in the manner of a transmission gate, thereby steering a desired data path.

Figure 4:
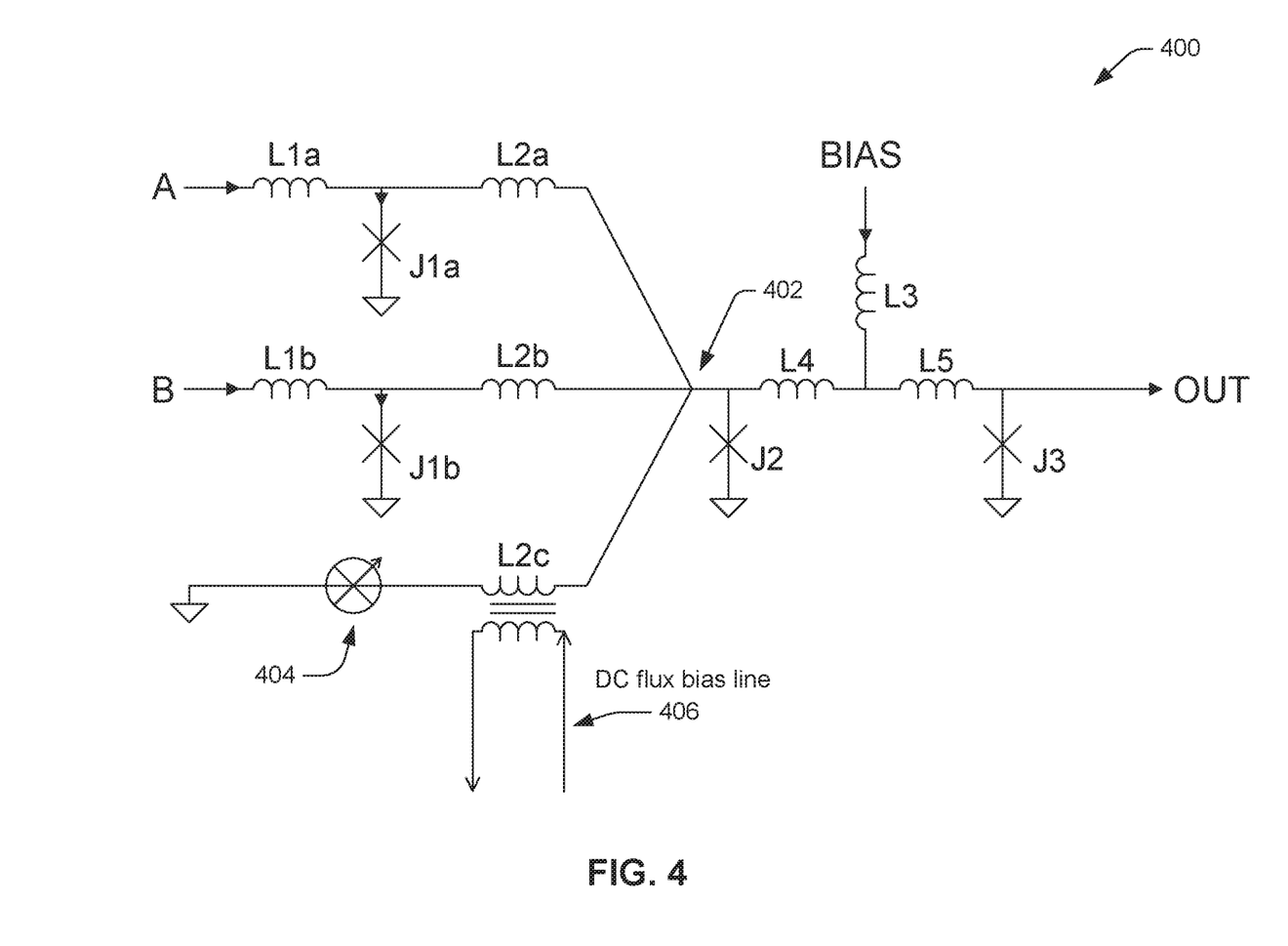
FIG. 4 is a circuit diagram of an example reciprocal quantum logic (RQL) gate switchable between AND and OR logical functions.

A device or switch as described herein can be used to provide a controllable DC bias. As an example, another RQL application includes inserting a superconducting switch as described herein into an RQL majority gate and toggling it to effectively switch the majority gate from providing OR functionality to AND functionality on the fly, modifying the fundamental logical operation of a given block, as desired. FIG. 4 provides an example OR-or-AND RQL gate circuit 400, modified from a similar gate described in U.S. Pat. No. 10,084,454, which is incorporated by reference. Gate circuit 400 includes logical decision Josephson junction J2 being shared amongst all three prongs of a three-prong input stage as well as the single prong of an amplifying Josephson transmission line (JTL) output stage. The input prongs meet at dovetail node 402. Each prong of the input stage includes a storage inductor, L2a, L2b, L2c. Two prongs of the input stage provide logical inputs A, B as positive or negative single flux quantum (SFQ) pulses. An AC and DC bias signal is provided on input BIAS to the output stage and serves to clock the gate. A DC flux bias line 406 is inductively coupled to the lower input prong via a transformer that includes inductor L2c to effectively provide a positive SFQ pulse to this input prong at system start-up. A superconducting switch 404 of the type described in this application, indicated here by an encircled "X" symbol with an arrow indicating its switchability, is located in series with inductor L2c, and can be provided on either side of the inductor.

If the lower input prong of gate circuit 400 did not include DC flux bias line 406 or superconducting switch 404, but still tied inductor L2c to circuit ground on the other side of inductor L2c from its connection to dovetail node 402, the circuit would behave as an AND gate. Once logical decision Josephson junction J2 triggered in response to asserted inputs A and B, positive currents in storage inductors L2a and L2b would be destroyed, a negative current would be induced into substitute storage inductor L2c, and a positive current would be propagated into the output stage for amplification as a positive SFQ output pulse indicating the logical AND of inputs A and B. Thereafter, any negative pulses applied to de-assert any previously asserted inputs among logical inputs A and B would bias logical decision Josephson junction J2 to untrigger upon the next negative portion of the AC component of the bias signal BIAS, which in turn would propagate a negative pulse to de-assert the output of the gate circuit.

If, in contrast, the lower input prong of gate circuit 400 included DC flux bias line 406 and its transformer coupling to inductor L2c, but did not include superconducting switch 404 in series with inductor L2c, the circuit would behave as an OR gate. DC current provided through DC flux bias line 406 would stay constant throughout system operation. At system start-up, the DC current through DC flux bias line 406 would couple current into input inductor L2c to which it is transformer-coupled, via the transient that occurs at system power-up, putting a positive current (e.g., one $\Phi_0$ worth of current) into inductor L2c once at the beginning of operation, which would contribute to the biasing of logical decision Josephson junction J2 just as much as biasing from either of the logical inputs A, B. Upon assertion of either of the logical inputs A, B, logical decision Josephson junction J2 would trigger, propagating a positive SFQ pulse through to the output, indicating satisfaction of the logical OR condition.

However, the inclusion of superconducting switch 404 in series with inductor L2c permits selectability between either of these two configurations, i.e., allows the gate circuit to selectably become either an AND gate or an OR gate depending on the state of switch 404. On system start-up, with switch 404 closed to permit current flow therethrough, DC current on DC flux bias line 406 ramps up and starts gate 404 in OR mode, i.e., gate 404 functions as an OR gate, as described above. Switch 404 may then subsequently be opened denying current flow therethrough, to place gate 400 in AND mode, i.e., such that gate 404 functions as an AND gate, as described above. Gate 400 can be returned to OR mode by reinitializing the circuit, e.g., by returning the DC current through DC flux bias line 406 to zero with switch 404 still open, then closing switch 404 and ramping up the DC current through DC flux bias line 406 again.

Switchable AND-or-OR gate 400 of FIG. 4 provides just one example of a switchable RQL gate that can make use of a bistable superconducting device or superconducting switch as described herein. In an alternative configuration, not illustrated, a bias quantizing Josephson junction J1c (not shown) can be connected between, on one side, transformer-coupled input inductor DC_c_O (not shown) and substitute storage inductor L2c, and, on the other side, a circuit ground such that quantizing Josephson junction J1c (not shown) quantizes the DC bias current supplied through DC bias DC_c_O (not shown) and improves operating margins. In such configuration, DC_c_O would be tied to the circuit ground on the other side from the node where it is connected to quantizing Josephson junction J1c. Such a circuit could still include switch 404 in series with DC flux bias line 406 to provide logical function switchability.

In addition to logical function switchability for RQL gates, a bistable superconducting device or superconducting switch as described herein can be implemented in RQL-accessible ROMs, allowing for field programmable states in RQL circuitry. The device or switch reduces footprint of a memory unit cell by removing the requirement for a large transformer. This allows for a substantial increase in memory density.

Beyond superconducting logic applications, bistable superconducting devices or superconducting switches as described herein can serve as programmable resistors, allowing the steering of currents via control lines. Such applications can be used to provide or deny bias to entire blocks on a chip.

Steering currents can also be useful in JMRAM-style applications, where controlled DC currents are used to write states to magnetic cells in an array. To realize very dense memories, JMRAM technologies use magnetic devices that are structurally somewhat similar, albeit functionally fundamentally different, from the presently described devices. They typically require fairly high current, on the order of milliamps, to switch their memory state from a logical zero to a logical one. Devices and switches as described herein, that can go from a zero resistance state to a non-zero resistance state and can be used to route milliamps of current successfully and thereby to drive JMRAM memory cells between states, can overcome many limitations of current JMRAM driver designs.

Conventional Josephson junctions exhibit a critical current $I_c$ that is proportional to their area and a resistance $R_N$ for normal state current that is inversely proportional to their area. This leads to the definition of a characteristic voltage $V_c = I_c R_N$, which can be used as a benchmark in Josephson junction comparisons. Low $I_c R_N$ value devices can be used as switchable low value resistors to mitigate flux trapping degradation of some RQL circuits. For example, in inductors connecting RQL Josephson transmission lines (JTLs) (i.e., those inductors that connect JTL elements to each other in series to carry data from one RQL circuit element to the next), low $I_c R_N$ value devices can act as low value resistors. In RQL bias inductors (i.e., those inductors used to deliver AC bias current, acting as a system clock, to a pair of Josephson junctions that make up an element of a JTL), low $I_c R_N$ value devices can act as low-value resistors during cooldown, i.e., during the lowering of the temperature of the circuit to its cryogenic operating temperature, but can be switched into a superconducting (high $I_c$) state for operation. During cooldown, the resistive switch thereby eliminates flux that would otherwise provide an unwanted static bias to the circuit and would undesirably alter its logical operations. Then, once cooldown is complete and stray flux is fully mitigated, the switch in its superconducting mode would be effectively transparent to the circuit's logical operation.

Bistable superconducting devices or superconducting switches as described herein expand the library of circuit components available to the designers of superconducting circuits, and differ structurally and functionally from prior devices used in MRAM and JMRAM. MRAM is a room-temperature technology and has no ability to carry supercurrent. Devices used in JMRAM are used as Josephson phase elements and always exist in the superconducting regime. Unlike JMRAM, in bistable superconducting devices or superconducting switches as described herein, the critical current in one of the states is deliberately suppressed. A superconducting switch as described herein acts like a JMRAM in the sense that it switches between one state and another, but it is distinguishable in that the thicknesses of the magnetic layers are tuned in exactly such a way that a high $I_c$ state is achieved in one parallel/antiparallel configuration whereas a persistent low $I_c$ state (e.g., essentially zero) is achieved in the other parallel/antiparallel configuration, as illustrated in FIGS. 3A and 3B. By contrast, JMRAM technology is a phase change technology that attempts to achieve maximum critical current $I_c$ in both states. Moreover, the inclusion of an insulating barrier in a bistable superconducting device or superconducting switch as described herein gives the device or switch a higher resistance value in the persistent low-$I_c$ state that is useful in switching applications.

The devices described herein also have advantages over "nTron"-based devices like those produced by MIT or Raytheon BBN Technologies Corp., which take a superconducting wire and drive it normal with heat, essentially reducing the critical current of the wire to zero by making it resistive. nTron-based approaches utilize a constricted superconducting path to locally lower the critical current, allowing a current pulse to send the constriction into the normal state. The hot electrons from the normal-state constriction are injected into an adjacent channel, warming the channel above its critical temperature, thereby increasing the resistance of the device through a thermal pulse. Disadvantages of nTron-based approaches include limited scalability, due to the nanometer scale dimensions of the constriction; energy dissipation, since the approach is based on a thermal effect; and stability, since an nTron-based device will return to the superconducting regime if the injection current is removed. By contrast, a bistable superconducting device or superconducting switch as described herein does not depend on a temperature increase in the device, but instead leverages a magnetic state, which is a more reliable control mechanism than a temperature change and does not involve the undesirable and expensive side-effects of heating in a cryogenic space.

From a design standpoint, a bistable superconducting device or superconducting switch as described herein provides a Josephson junction with a very high default critical current that can be switched into a zero or effectively zero critical current state that is persistent, thereby providing transistor-like functionality. One or more inductive control lines can be used to switch the device between these two states.

Figure 5:
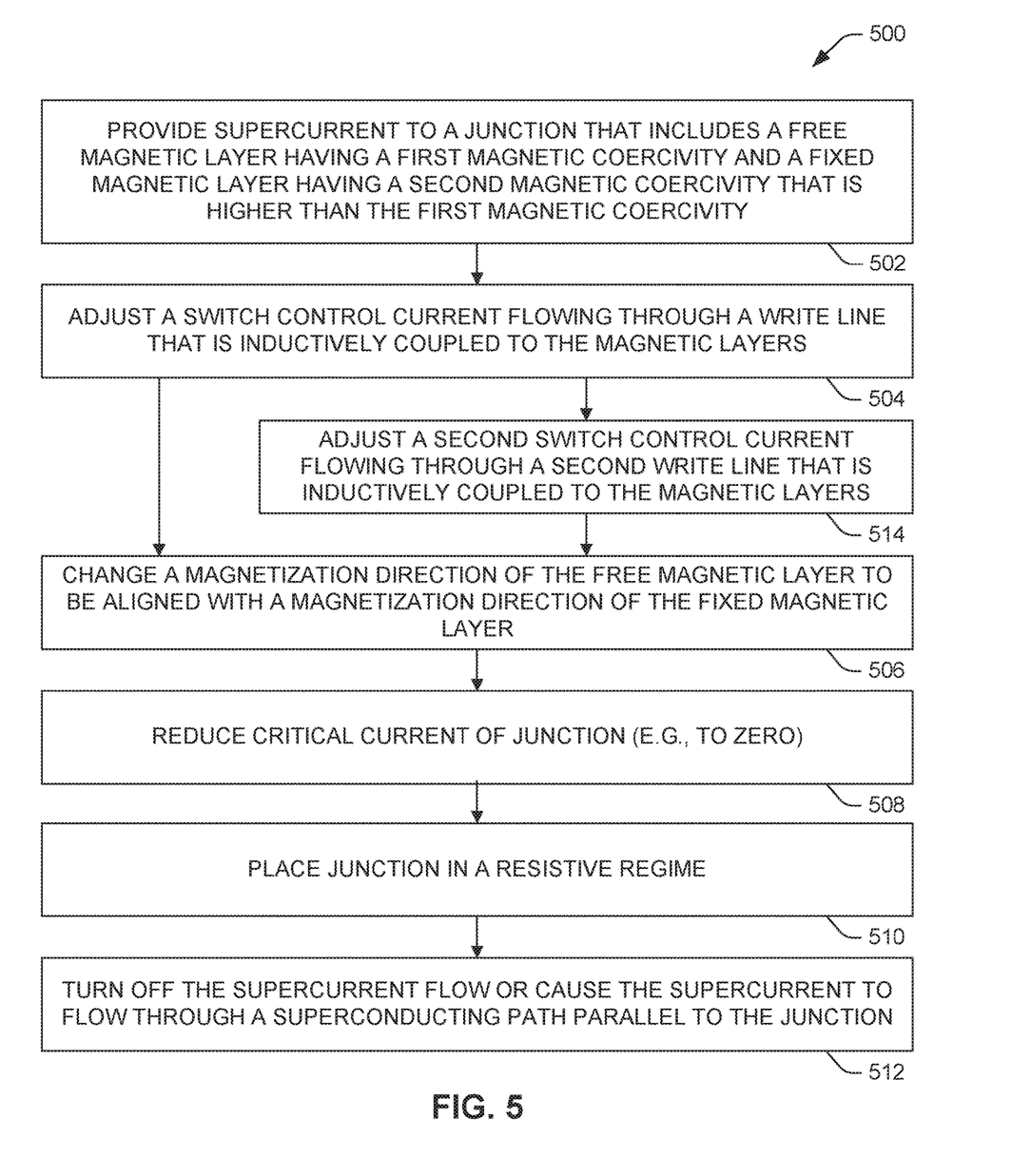
FIG. 5 is a flow chart illustrating an example method of supercurrent switching.

FIG. 5 is a flowchart illustrating a method 500 of superconducting switching. Supercurrent is provided 502 to a junction. The junction includes a free magnetic layer having a first coercivity and a fixed magnetic layer having a second coercivity that is higher than the first coercivity. The junction can initially start in a default superconducting regime wherein it has a relatively high (e.g., nonzero) critical current and thereby behaves like a conventional Josephson junction. In this default regime, a magnetization direction of the free magnetic layer is counter to with a magnetization direction of the fixed magnetic layer (i.e., the junction is in an antiparallel state).

Then, a switch control current flowing through a write line that is inductively coupled to the magnetic layers can be adjusted 504, which can change 506 a magnetization direction of the free magnetic layer to be aligned with a magnetization direction of the fixed magnetic layer (i.e., placing the junction in a parallel state). This can reduce 508 the critical current $I_c$ of the junction (e.g., to zero) and thereby place 510 the junction in a resistive regime. In the resistive regime, the junction has a resistance of at least more than a milliohm, and in some examples, more than an ohm (e.g., between about one and about ten ohms). The junction now being "switched," the supercurrent no longer flows through the junction. Instead, the supercurrent is turned off 512, or otherwise caused 512 to flow through a superconducting path parallel to the junction. This can, for example, switch the logical function of an RQL gate (e.g., between AND OR logical functionality), steer supercurrent, steer a data path, eliminate flux quantization in a loop containing the junction, drive JMRAM memory cells between states, or deactivate an output amplifier, among other potential switching effects. In some examples, in addition to the adjustment 504 of the switch control current, a second switch control current, flowing through a second write line that is inductively coupled to the magnetic layers, can also be adjusted 514. For example, the first switch control current can induce an easy axis magnetic field and the second switch control current can induce a hard axis magnetic field.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A bistable device comprising:
    a first superconducting metal layer and a second superconducting metal layer;
    a first ferromagnetic layer and a second ferromagnetic layer, both ferromagnetic layers being located between the first and second superconducting metal layers; and
    a normal metal spacer layer between the first and second ferromagnetic layers;
    wherein the bistable device is configured to switch, based on a control signal, between
        a resistive regime in which the device exhibits a resistance of greater than about one milliohm, and
        a superconducting regime in which the device behaves as a Josephson junction.

2. The device of claim 1, wherein
    the first ferromagnetic layer is a magnetically switching layer fabricated with a first magnetization; and
    the second ferromagnetic layer is a magnetically fixed layer fabricated with a second magnetization higher than the first magnetization.

3. The device of claim 2, wherein the first and second ferromagnetic layers are each made of any of elemental nickel, elemental cobalt, elemental iron, a cobalt-iron alloy, a nickel-iron alloy, or a nickel-iron-chromium alloy.

4. The device of claim 2, wherein the first ferromagnetic layer is a nickel-iron 80:20 permalloy and the second ferromagnetic layer is elemental nickel.

5. The device of claim 4, wherein the first ferromagnetic layer has a thickness of between about 1.9 nanometers and about 2.1 nanometers, and the second ferromagnetic layer has a thickness of between about 1.62 nanometers and about 1.79 nanometers.

6. The device of claim 5, wherein the first ferromagnetic layer has a thickness of about 2.0 nanometers, and the second ferromagnetic layer has a thickness of about 1.7 nanometers.

7. The device of claim 1, wherein the spacer layer is made of at least one of elemental copper, elemental ruthenium, elemental iridium, or elemental rhodium.

8. The device of claim 7, wherein the spacer layer has a thickness of between about 2.5 nanometers and about 7.5 nanometers.

9. The device of claim 1, further comprising an insulating barrier layer between the first ferromagnetic layer and the first superconducting metal layer.

10. The device of claim 9, wherein the insulating barrier layer is made of one of aluminum oxide, tantalum nitride, niobium silicon, aluminum nitride, or hafnium oxide, and wherein the device has a resistance of between about one and about ten ohms in the resistive regime.

11. A superconducting switch comprising the device of claim 1, and further comprising an easy axis field line that is inductively coupled to the first ferromagnetic layer to provide controlled switching of the device between a state in which the magnetization of the first ferromagnetic layer is parallel with the magnetization of the second ferromagnetic layer and a state in which the magnetization of the first ferromagnetic layer is antiparallel with the magnetization of the second ferromagnetic layer, thereby writing a binary state to the device to either permit or cut-off supercurrent flow between the first and second superconducting metal layers.

12. The superconducting switch of claim 11, further comprising a hard axis field line that is arranged, in a transverse plane of the switch, perpendicular to the easy axis field line, and, in a cross-sectional view of the switch, on the opposite side of the device from the easy axis field line, and which is inductively coupled to the at least one of the ferromagnetic layers.

13. A circuit comprising the superconducting switch of claim 12, wherein the superconducting switch is arranged in the circuit to provide a controllable DC bias.

14. A circuit comprising the superconducting switch of claim 12, wherein the circuit is a reciprocal quantum logic (RQL) circuit.

15. The RQL circuit of claim 14, wherein the RQL circuit is an RQL majority gate.

16. The RQL majority gate of claim 15, comprising at least three input prongs that converge at a dovetail node and an output amplifying Josephson transmission line (JTL) coupled between the dovetail node and an output node.

17. The RQL majority gate of claim 16 arranged as an OR-or-AND gate, wherein the at least three input prongs comprise:
a first logical input prong through which a first logical input signal is provided, the first logical input prong comprising a first storage inductor;
a second logical input prong through which a second logical input signal is provided, the second logical input prong comprising a second storage inductor; and
a third input prong comprising the superconducting switch,
wherein the gate is configured, by switching of the superconducting switch from a closed switch state to an open switch state, to change the functionality of the RQL majority gate from providing at the output node a logical OR of the first and second logical input signals in the closed switch state to providing at the output node a logical AND of the first and second logical input signals in the open switch state.

18. The RQL OR-or-AND gate of claim 17, wherein the third input prong comprises, in series with the superconducting switch, an inductor inductively coupled to a DC flux bias line configured to effectively provide a positive SFQ pulse to the third input prong.

19. The RQL OR-or-AND gate of claim 18, wherein the gate is configured, by switching of the superconducting switch from a closed switch state to an open switch state, to change the functionality of the RQL majority gate from providing at the output node a logical OR of the first and second logical input signals in the closed switch state to providing at the output node a logical AND of the first and second logical input signals in the open switch state.

20. The RQL OR-or-AND gate of claim 19, wherein the gate is configured, by zeroing DC current through the DC flux bias line with the superconducting switch in the open switch state, and then by switching of the superconducting switch from the open switch state to the closed switch state, and then by ramping up the DC current through the DC flux bias line, to change the functionality of the RQL majority gate from providing at the output node a logical AND of the first and second logical input signals in the open switch state to providing at the output node a logical OR of the first and second logical input signals in the closed switch state.

* * * * *